United States Patent [19]
Venaleck

[11] Patent Number: 4,588,239
[45] Date of Patent: May 13, 1986

[54] PROGRAMMED SOCKET

[75] Inventor: John T. Venaleck, Madison, Ohio

[73] Assignee: 4C Electronics, Inc., Mentor, Ohio

[21] Appl. No.: 719,638

[22] Filed: Apr. 4, 1985

Related U.S. Application Data

[63] Continuation of Ser. No. 471,280, Mar. 2, 1983.

[51] Int. Cl.⁴ .................. H01R 31/06; H01R 9/09; H01R 13/504
[52] U.S. Cl. .................. 339/17 CF; 29/842; 339/18 C; 339/19; 339/218 M
[58] Field of Search ............ 339/17 CF, 18 R, 18 B, 339/18 C, 18 P, 19, 222, 218 R, 218 M, 275 R, 275 B, 17 C, 17 LC; 174/52 FP; 29/842, 843

[56] References Cited

U.S. PATENT DOCUMENTS

| | | | |
|---|---|---|---|
| 3,033,914 | 5/1962 | Acosta-Lleras | 174/68.5 |
| 3,040,119 | 6/1962 | Granzow | 174/68.5 |
| 3,177,405 | 4/1965 | Gray | 339/17 E X |
| 3,668,299 | 6/1972 | McNeal | 29/843 X |
| 3,697,818 | 10/1972 | Boursin | 339/17 CF X |
| 3,811,973 | 5/1974 | Lesh et al. | 174/68.5 |
| 3,923,359 | 12/1975 | Newsam | 339/17 M |
| 4,090,667 | 5/1978 | Crimmins | 339/19 |
| 4,398,235 | 8/1983 | Lutz et al. | 339/17 CF X |
| 4,401,353 | 8/1983 | McDevitt, Jr. et al. | 339/18 C |
| 4,516,816 | 5/1985 | Winthrop | 339/176 MP X |
| 4,540,226 | 9/1985 | Thompson et al. | 339/17 CF |

FOREIGN PATENT DOCUMENTS

| | | | |
|---|---|---|---|
| 2842892 | 4/1979 | Fed. Rep. of Germany | 339/17 C |
| 7602605 | 9/1976 | Netherlands | 339/275 B |

OTHER PUBLICATIONS

A. H. Johnson, "Wire Fan-Out Device Carrier", *IBM Technical Disclosure Bulletin*, vol. 21, No. 6, Nov. 1978, pp. 2320-2321.

*Primary Examiner*—Gil Weidenfeld
*Assistant Examiner*—Steven C. Bishop
*Attorney, Agent, or Firm*—Renner, Otto, Boisselle & Lyon

[57] ABSTRACT

A socket can be programmed to adapt the pin out configuration of an integrated circuit for convenient plug-in use or substitution in an environment, such as a socket, ordinarily intended for a similar integrated circuit with a different pin-out configuration. The invention includes a support, a first plurality of electrical contacts mounted in a prescribed pattern on one side of the support, a second plurality of electrical contacts mounted in a similar prescribed pattern on the other side of the support, at least one of the first contacts and some of the second contacts being electrically isolated from each other on the same and opposite sides of the support, and printed circuit traces and plated through holes coupling respective first contacts on one side of the support to respective second contacts on the other side of the support. Encapsulating material about the support, traces thereon, and contacts where they are joined to the traces provides structural strength and integrity for the device and environmental isolation for the contact/trace junctures. A cover guides pin contacts to engagement with respective female contacts in the programmed socket. The invention also relates to a method of effecting the desired programmed interconnections and a method of making the programmed socket.

8 Claims, 10 Drawing Figures

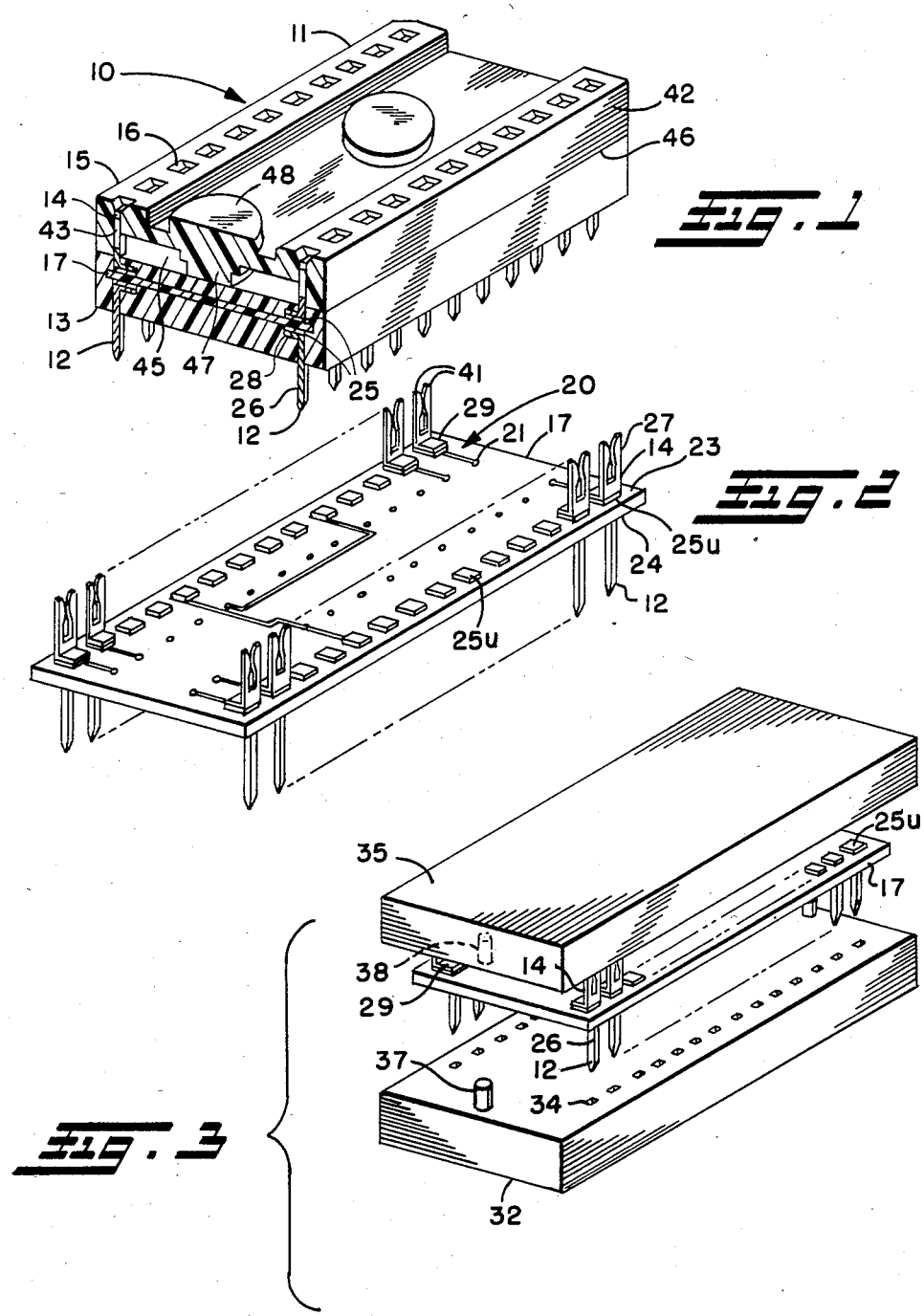

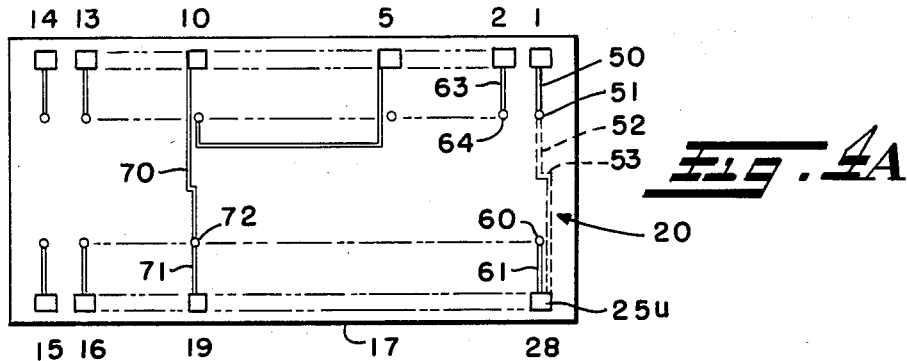
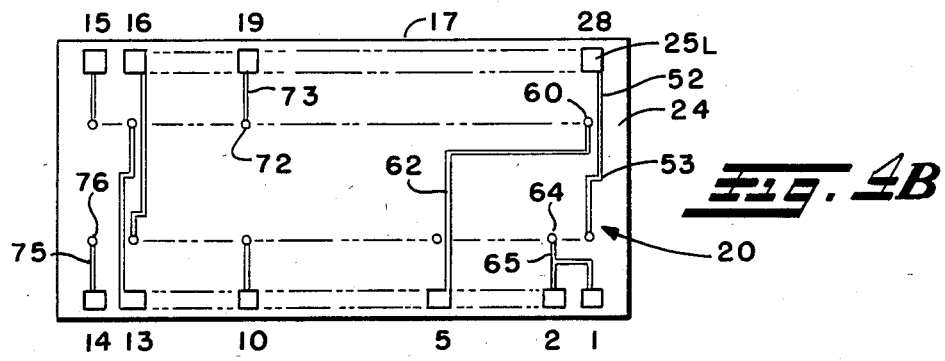
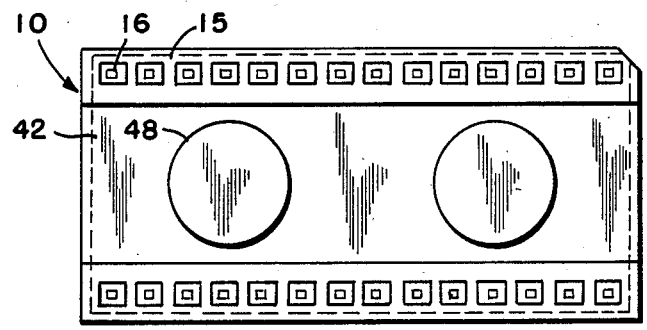
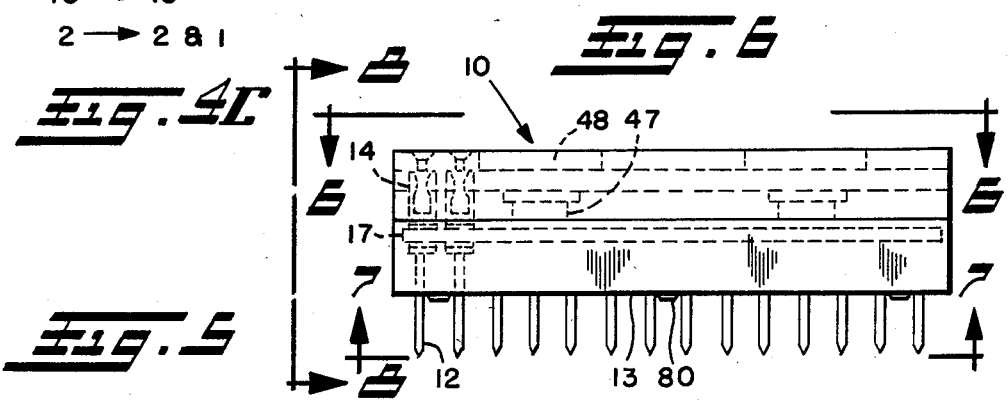

PROGRAMMED SOCKET

This application is a continuation of application Ser. No. 471,280, filed 3-2-83, now abandoned.

TECHNICAL FIELD

The present invention relates generally to electrical connectors and, more particularly, to a programmed socket for altering the effective pin-out arrangement of integrated circuits and like devices.

BACKGROUND

In the modern electronics industry integrated circuits and similarly mechanically configured devices frequently are used. Such devices may be, for example, a microprocessor, a read only memory (ROM), a random access memory (RAM), logic arrays, integrated logic circuits, switches, etc. such devices usually are mechanically configured to have a three dimensional rectangular package body within which the active or passive circuitry components, switches, etc., are contained, and a plurality of electrical leads extending outwardly from the package to provide electrical connection for respective circuits etc. within the package to circuitry externally of the package. Such devices generally have a dual-in-line package (DIP) configuration. For convenience of description, each of such devices will be referred to hereinafter as an integrated circuit device; however, such label is intended to include the previously listed and other types of devices that are contained in a packaged configuration preferably of the DIP type with plural electrical leads extending outwardly from the package for the mentioned purpose. Moreover, such electrical leads sometimes are referred to as terminals, contacts, pins, etc., and for convenience of the following description, the same will be referred to as pins.

Electronic circuitry usually is designed for use with a particular integrated circuit, such as a specific microprocessor manufactured by a specific manufacturer and having a specific pin-out pattern or configuration, whereby, for example, pin number 1 of the integrated circuit package may be intended to connect to a voltage source, pin number 2 may be an interrupt input for the microprocessor, pin number 3 may be a ground connection, etc. The layout and interconnections of printed circuit traces on a printed circuit board intended to use a specified microprocessor usually are designed for use with a particular microprocessor of a particular manufacturer. However, occasions arise that it becomes desirable, even necessary, to substitute in an electronic circuit a different integrated circuit device than the one for which the electronic circuit originally was designed, and in such a case it is possible that the new integrated circuit device cannot or cannot readily be substituted because it may have a pin-out configuration that is different from the pin-out configuration of the original integrated circuit device.

It would be desirable to facilitate, even more broadly to enable, the substitution of one integrated circuit device for another when the pin-out configurations of the two integrated circuit devices are not the same. It also would be desirable to accomplish the same in minimum space so that such an adaptation can be made within the frequently confined space available in various electronic devices.

SUMMARY OF THE INVENTION

In accordance with the present invention a programmed socket adapts an integrated circuit device with one pin-out configuration for use in circuitry designed for use with an integrated circuit device that has a different pin-out configuration. The invention also provides for effecting such adaptation in a small space. The invention, too, relates to a method of effecting such adaptation and a method of making a programmed socket for the purposes expressed.

Briefly, the invention relates to an electrical connection device including a support, a first plurality of electrical contacts mounted in a prescribed pattern with respect to the support on one side thereof for electrically coupling with respective first members engaging therewith, a second plurality of electrical contacts mounted in a prescribed pattern with respect to the support on another side thereof for electrically connecting with respective second members engaging therewith, at least some of the first contacts being electrically isolated from each other and from some of the second contacts, and an arrangement of electrical conductors positioned with respect to the support for electrically coupling respective first contacts with respective second contacts. According to the preferred embodiment and best mode of the invention, as is described in greater detail below, the programmed socket effects the desired adaptation by providing two electrically isolated groups of contacts respectively on opposite sides of a support, providing a socket type package for the contacts and support, connecting the pins of one integrated circuit with the respective ones of the first group of contacts, connecting the other contacts respectively to other electrically conductive means, such as the contacts of an existing integrated circuit socket, for example, and using printed circuit traces on and plated through holes through the support to provide electrical connections between respective contacts on one side with respective contacts on the other side. As a result of the particular pattern of those printed circuit traces, the invention can be programmed to connect virtually any of the first group of contacts to any of the second group of contacts.

According to another aspect of the invention, a method of electrically coupling the terminals of one electrical device with circuitry configured electrically to couple with the terminals of another electrical device includes electrically connecting the terminals of the one device respectively to plural first electrical contacts mounted with respect to one side of the support, electrically connecting the terminals of another device respectively to plural second electrical contacts mounted with respect to another side of the support, electrically isolating a plurality of the first contacts from a plurality of the second contacts, and electrically coupling at least one contact on one side of the support with at least one contact on the other side of the support thereby to alter the apparent terminal configuration of at least one of such devices for electrical coupling with the other of such devices.

According to a further aspect of the invention, a method of making an electrical connector includes forming printed circuit traces on both sides of a support to provide electrical connections between selected contact locations on one side of the support and respective selected contact locations on another side of the support, mounting plural first electrical contacts on one side of the support in electrical isolation from each other and in electrical connection with respective printed circuit traces, and mounting plural electrical contacts on the other side of the support in electrical isolation from each other and from a plurality of the first contacts and in electrical connection with respective printed circuit traces, whereby respective first and second contacts are electrically connected via such printed circuit traces.

BRIEF DESCRIPTION OF THE DRAWINGS

In the annexed drawings:

FIG. 1 is a partial isometric view, partly broken away in section, of a programmed socket in accordance with the present invention;

FIG. 2 is an isometric view of the support, contacts, and some printed circuit traces used in the programmed socket of FIG. 1;

FIG. 3 is an exploded isometric view of the support, contacts, and carrier blocks used in connection with the method of making a programmed socket in accordance with the invention;

FIGS. 4A and 4B are, respectively, top and bottom views of the support of FIG. 2;

FIG. 4C is a partial chart of the contact interconnections provided by printed circuit traces coupled to solder pads at respective locations on the top and bottom of the support shown in FIGS. 4A and 4B;

FIG. 5 is a side elevation view of a programmed socket in accordance with the invention;

FIG. 6 is a top plan view of the programmed socket looking generally in the direction of the arrows 6—6 of FIG. 5;

DETAILED DESCRIPTION OF THE INVENTION

Figure 7:
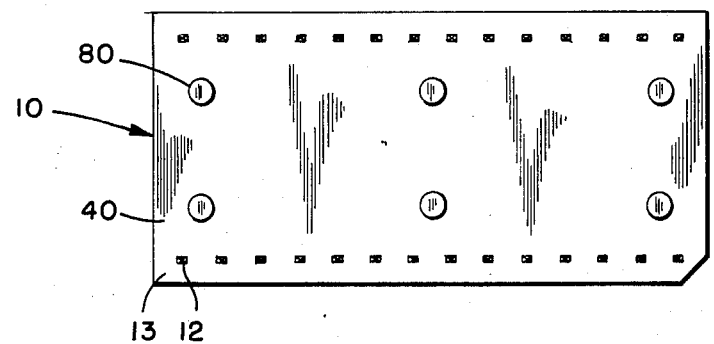
FIG. 7 is a bottom plan view of the programmed socket looking generally in the direction of the arrows 7—7 of FIG. 5.

Referring now in detail to the drawings, wherein like reference numerals designate like parts in the several figures, the preferred embodiment and best mode of the present invention of a programmed socket is generally indicated at 10 in FIG. 1. The programmed socket 10 is in the configuration of an integrated circuit package, integrated circuit socket, etc., in the form of a dual in-line package 11. A plurality of male pin contacts 12 extend from the bottom 13 of the package 11 for connection, for example, directly to the printed circuit traces on a conventional printed circuit board, say using wave soldering techniques to effect completion of connections, by an integrated circuit socket, etc. A plurality of female fork type contacts 14 face the top 15 of the package 11 to connect with the pins of an integrated circuit device inserted into openings 16.

The programmed socket 10 of the present invention provides an interface between circuitry to which the male pin contacts 12 are connected and circuitry to which the female contacts 14 are connected. The male pin contacts 12 and the female contacts 14 preferably are arranged in identical patterns on the support 17 so that the programmed socket 10 requires minimum space, and the only electrical connections between respective male pin contacts 12 and respective female contacts 14 is by means of printed circuit traces generally indicated at 20 on and plated through holes 21 through the support 17. By programming the printed circuit traces 20 and holes 21, the apparent location of any given pin of an integrated circuit device plugged in to the top of the programmed socket 10 can be programmed to appear at another selected location at the bottom of the programmed socket. Thus, for example, one integrated circuit device having pin number 28 as a ground may be replaced by another integrated circuit device that uses pin number 1 as the ground with the programmed socket 10 of the present invention connecting contact location number 1 on the top of the programmed socket to contact location number 28 on the bottom of the programmed socket.

The fundamental features of the programmed socket 10 in accordance with the invention, then, include the plural contacts 12 and 14 mounted in electrical isolation on the support 17 and connected in a programmed manner from one side of the support to the other by the printed circuit traces 20 and plated through holes 21. As will be described in further detail below, other important aspects of the invention include a method for effecting electrical connections and a method of making the programmed socket.

The support 17 preferably is a printed circuit board of electrically non-conductive material. The printed circuit traces 20 preferably are formed on the support 17 in conventional manner. The support 17 has a plurality of holes 21 therethrough, each of which preferably is plated through to provide an electrically conductive path from the top side or surface 23 to the bottom side or surface 24. (Reference to top and bottom or upper and lower as well as to surfaces and sides herein are for convenience only and are not intended to be limiting with respect to configuration or operation of the programmed socket 10).

Each of the printed circuit traces 20 terminates in a terminal pad, such as those shown at 25 in FIG. 2. Each of the contacts 12, 14 has a contact portion 26, 27 extending generally linearly in a direction to be electrically connected to a member placed to engagement therewith and a flat base portion 28, 29 extending generally perpendicularly to the contact portion for electrical connection to respective terminal pads. Respective contacts 12, 14, are soldered to such pads 25 for electrical and mechanical connection thereto. Preferably the pads 25U (the suffix "U" indicating upper) on the top 23 and those pads 25L ("L" for lower) on the bottom 24 of the support 17 are arranged in an identical dual-in-line pattern, as is shown in the drawings, and, accordingly, the contacts 12 are arranged in the same configuration, layout, or pattern as are the contacts 14. Therefore, the pad 25U at contact location 1 on the top 23 is directly over the pad 25L at contact location 1 on the bottom 24 of the support 17. In the illustrated embodiment there are 28 contact locations on each side of the support 17 corresponding in number and spacing to the pins of a conventional 28-pin DIP integrated circuit device.

In accordance with the method of making the programmed socket 10, the layout of the printed circuit traces 20 is determined and the printed circuit traces 20 and plated through holes 21 are formed on and through the support 17 in conventional manner, for example using a photoetching and plating technique. The contacts 12 then are placed in a carrier block 32 shown in FIG. 3, such that the pin contact portions 26 thereof extend into openings 34 in the carrier block and the contact bases 28 are positioned to engage respective terminal pads 25 on the bottom 24 of the support 17. In a similar manner the contacts 14 are mounted in openings (not shown) in the upper carrier block 35, being held therein, for example, by slight frictional forces, to place the bases 29 thereof in alignment with respective terminal pads 25 on the top surface 23 of the support 17. One or more alignment pegs 37 of the carrier block 32 fit into respective alignment openings 38 in the carrier block 35 to facilitate aligning the same and the contacts therein with respect to each other and preferably with respect to the support 17. Accordingly, the carrier blocks 32, 35 and the support 17 are generally sandwiched together to place the bases of the respective contacts 12, 14 into direct engagement with the respective terminal pads 25. Preferably such terminal pads 25 (or the bases of the contacts, if desired) have solder intially applied thereto prior to such sandwiching. Thereafter, with the sandwiching performed, heat may be applied to melt the solder thereby mechanically and electrically securing respective contacts to respective terminal pads 25. After the solder has solidified, the carrier blocks 32, 35 may be removed leaving the assembled support 17 and contacts 12, 14, as is shown in FIG. 2.

Another step to further completion of the programmed socket 10 is the encapsulating of the support 17, printed circuit traces 20 thereon, and preferably at least a portion of each of the contacts 12, 14, for example to a depth away from the surface of the support 17 that is adequate at least to cover the respective bases 28, 29 of the contacts. Such encapsulating may be carried out in a plastic injection molding machine to provide the encapsulating lower body 40 clearly seen in FIG. 1. The body 40 may be formed of electrically non-conductive plastic or plastic-like material having adequate strength securely to hold the male pin contacts 12 in relatively rigid extending format seen in FIG. 1 and also to hold the female contacts 14 securely with respect to the support 17, on the one hand, while permitting resilient bending of the contact tines 41 to receive a male contact inserted therebetween. In addition to providing the structural strength, the encapsulating body 40 also preferably provides an hermetic seal enclosing the junctions of the terminal pads 25 with respective contacts 12, 14, which helps to prevent oxidation or other chemical activity at the junctions that would tend to reduce the electrical conductivity, for example, thereof. The encapsulating body 40 also protects the electrical integrity of the printed circuit traces 20 and plated through holes 21, for example helping to avoid damage thereto as forces are applied to the contacts 12, 14 during use of the programmed socket 10.

A cover 42 (FIG. 1) preferably of electrically non-conductive plastic or plastic-type material is placed over the female contacts 14 to protect the same and to guide male contacts, such as the pins of an integrated circuit device, through openings 16 to engage respective pairs of tines 41 of the female contacts. Within the cover 42 may be a plurality of discrete chamber areas 43 within which individual female contacts 14 are located and preferably guided into alignment with respective openings 16. A hollow space 45 formed in the cover provides resiliency thereof, minimizes material required, tolerates imperfections in the encapsulating body, and facilitates providing deformation space for the female contacts 14. The cover 42 is ultrasonically welded at 46 to the encapsulating lower body 40; alternatively, other means may be employed to secure together the cover and encapsulating body. Further securing the cover to the encapsulating body a weld tab 47 is formed on the bottom of the cover, and such weld tab is ultrasonically welded directly to the body 40. To strengthen the area of the cover 42 where each of preferably plural weld tabs 47 respectively depend are reinforced zones 48 comprising a relatively thick build-up of material.

The use of the weld tabs 47 and reinforcing zones 48 strengthening the cover 42 enables the cover as a whole to be of relatively low or thin profile, thereby reducing the space requirements for the programmed socket 10. The encapsulating lower body 40 not only provides the above described encapsulating function, but also provides the lower exterior of the programmed socket 10, thus further reducing the number of components required for the socket and the space requirements. Additionally, the strengthening ability of the encapsulating body 40 enables use of minimum size contacts and minimum thickness of the printed circuit board support 17, even further reducing the overall space requirements for the programmed socket 10. The positioning of the contacts 12, 14 in identical patterns such that each respective pair of contacts 12, 14 on the top and bottom of the support 17 is directly aligned minimizes surface space requirements for the programmed socket 10, too.

Turning to FIGS. 4A, 4B and 4C, the interconnection technique for coupling respective pairs of contacts 12, 14 is illustrated. FIG. 4A shows a top view of the support 17, and FIG. 4B shows a bottom view of the support 17 with several representative printed circuit traces 20, plated through holes 21 and terminal pads 25, but without any of the contacts 12, 14. Pin location numbers 1–28 are shown along the edges of the top and bottom views of the support 17 in FIGS. 4A and 4B. The lefthand column in FIG. 4C represents the pin or contact location number, such as pin number 1 or location 1, of respective solder terminal pads 25U (FIG. 4A) on the upper surface 23 of the printed circuit board support 17. The righthand column of FIG. 4C represents contact locations of the illustrated terminal pads 25L (FIG. 4B) on the lower surface 24 of the support 17. The arrows between the lefthand and righthand columns in FIG. 4C indicate an electrical connection via a printed circuit trace 20 and placed through hole 21 between the respective identified pairs of terminals pads and, thus, electrical contacts 12, 14 on the upper and lower surfaces of the support 17.

Thus, for example, in the first row of the chart in FIG. 4C, there is indicated an electrical connection between terminal pad 25U at location number 1 on the upper surface 23 with terminal pad 25L at location number 28 on the lower surface 24 of the support 17. Such connection is provided by a printed circuit trace 50, plated through hole 51, and printed circuit trace 52, which has an offset 53 therein. The trace 50 is on the upper surface 23, and the trace 52 is on the lower surface 24 of the support 17; the plated through hole 51 is an electrically conductive path between the traces 51, 52 between the upper and lower surfaces of the support 17. The offset 53 in the trace 52 permits such trace to reach terminal pad 25L at location number 28 without intersecting plated through hole 60, which is aligned approximately with the center of the terminal pad 25L at location number 28 along an axis parallel to the illustrated righthand edge of the support 17 in FIG. 4B. Trace 52 and offset 53 are shown in dotted outline in the top view of the support 17 in FIG. 4A.

The second line in the chart of FIG. 4C indicates the connection between terminal pad 25U at location number 28 and terminal pad 25L at location number 5. Such connection is effected by the printed circuit trace 61 on the upper surface 23, plated through hole 60, and printed circuit trace 62 on the lower surface 24 of the support 17. Moreover, as is seen in the last line of the FIG. 4C chart, terminal pad 25U at location number 2 on the upper surface 23 is connected to two terminal pads 25L, respectively at locations number 1 and number 2, on the lower surface 24; such connections are made via the printed circuit trace 63, plated through hole 64, and printed circuit traces 65. Another example of a double connection is that provided by the terminal pads 25U at locations number 10 and number 19 on the upper surface 23 with terminal 25L on the lower surface 24 of the support 17 via printed circuit traces 70 and 71, plated through hole 72, and printed circuit trace 73. As is seen in the eighth and ninth lines of the FIG. 4C chart, aligned terminal pads 25U, 25L at location 14 on the upper and lower surfaces 23, 24 are connected together, as is seen in FIGS. 4A and 4B by traces 74, 75 and plated through hole 76; and there is a similar one for one connection of aligned terminal pads 25U, 25L at location number 15 on the upper and lower surfaces.

According to the preferred embodiment and best mode of the present invention, the particular programmed interconnection of terminal pads 25U with terminal pads 25L can be selected as desired or required for particular circumstances. The configuration illustrated herein for the interconnection pattern only is intended to be exemplary. Preferably each of the electrical contacts 12 is electrically isolated from the other and from those electrical contacts 14 on the opposite side of the support 17, and the same is true for the contacts 14; and the only interconnection between respective electrical contacts is via printed circuit traces and/or plated through holes. In the usual case some of the respectively aligned contacts 12, 14, i.e. at the same contact locations, will be connected together and some of the respectively not aligned contacts 12, 14 will be connected together. To minimize the space requirements and to maximize the integrity of electrical connections provided by the programmed socket 10, it is preferred that plated through holes be used to complete circuits from one side or surface of the preferably planar electrically non-conductive support 17 to the other side or surface thereof.

In some circumstances a hole may be formed in the support 17 to pass an electrical contact therethrough, whereby a single integral electrical contact is provided at the given location, such as location number 14, for both the lower contact 12 and upper contact 14 there when the upper and lower contacts at location number 14 are intended to be connected. This is not preferred for the sake of uniformity of manufacturing technique, facility of manufacturing, and strength of the programmed socket 10. However, such configuration may be helpful in those instances where the printed circuit traces become excessively complex and the added space on the support 17 is needed.

Figure 8:
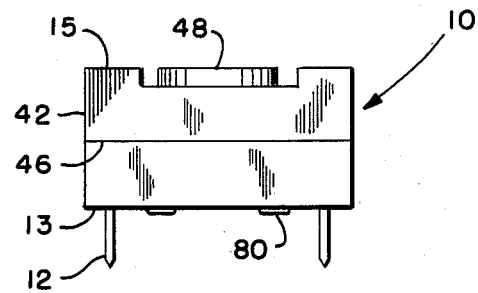
FIG. 8 is an end elevation view of the programmed socket looking generally in the direction of the arrows 8—8 of FIG. 5.

Briefly referring to FIGS. 5–8, the external layout of the programmed socket 10 is illustrated. The aligned pattern orientation of the contacts 12, 14 is seen in FIG. 5 protruding in parallel directions. The orientation of openings 16 in the top 15 of the socket 10 to guide respective pins into electrical connection with the female contacts 14 is seen particularly in FIGS. 5 and 6. The protruding male pin contacts 12 at the bottom 13 of the socket 10, and spacer bumps 80 are seen particularly in FIGS. 5, 7 and 8.

In view of the foregoing, it will be appreciated that the programmed socket 10 in accordance with the present invention may be programmed insofar as the connections of respective contacts therein are concerned, and the socket then may be used to interface between an integrated circuit device (or, as was mentioned earlier, virtually any dual in line package type device or the like), and a socket, connector, circuitry, etc. to which such integrated circuit device is to be connected but otherwise would not be directly connectable because of an unfavorable or unmatched pin output/connection configuration. For example, a 28 pin integrated circuit that has pin 1 used as ground and pin 28 used as a Vcc input may be substituted in an electrical circuit that ordinarily uses a different integrated circuit that has pin 1 used as Vcc and pin 28 as ground, all other pins of both integrated circuit being the same or having the same function, etc., by connecting the substituted integrated circuit in a programmed socket 10 that connects contact 14 at location 1 to contact 12 at location 28 and contact 14 at location 28 to contact 12 at location 1 and connecting the programmed socket to such electrical circuit.

STATEMENT OF INDUSTRIAL APPLICATION

The invention may be used to effect electrical connections and, more particularly, to adapt the pin-out configuration of one device to another pin-out configuration.

I claim:

1. An electrical connection device, comprising a support, first plural electrical contact means mounted in a prescribed pattern with respect to said support on one side thereof for electrically coupling with respective first members engaging therewith, second plural electrical contact means mounted in a prescribed pattern with respect to said support on another side thereof for electrically connecting with respective second members engaging therewith, at least some of said first contact means being electrically isolated from at least some of said second contact means, electrically conductive means positioned with respect to said support for electrically coupling respective first contact means with respective second contact means, further comprising and electrically non-conductive encapsulating body molded directly to and about at least substantially all of said support, said electrically conductive means, and at least part of each of said electrical contact means to form an integral structure therewith, said support comprising an electrically non-conductive substantially planar printed circuit board, said electrically conductive means comprising printed circuit traces on both sides of said printed circuit board and plated through holes for electrically connecting respective traces on opposite sides of said printed circuit board, said printed circuit traces including terminal pads for connection to respective electrical contact means forming electrical junctures therewith, said encapsulating means including means for encapsulating said junctures, said electrical contact means comprising a contact portion extending generally in a first direction and a base portion extending in a direction substantially perpendicular to said first direction, said junctures comprising a soldered connection between respective electrical contact means base portions and respective terminal pads of printed circuit traces, and said encapsulating body comprising means for encapsulating at least substantially all of said base portion of said electrical contact means, thereby providing a substantially hermetic seal of said junctures and mechanical retention of said electrical contact means with respect to said terminal pads, wherein said first plural electrical contact means comprises a plurality of female type electrical contacts, and further comprising cover means for covering said female contacts, said cover means including opening means therein for guiding respective male contacts into electrically conductive engagement with respective female contacts.

2. An electrical connection device, comprising a support, first plural electrical contact means mounted in a prescribed pattern with respect to said support on one side thereof for electrically coupling with respective first members engaging therewith, second plural electrical contact means mounted in a prescribed pattern with respect to said support on another side thereof for electrically connecting with respective second members engaging therewith, at least some of said first contact means being electrically isolated from at least some of said second contact means, electrically conductive means positioned with respect to said support for electrically coupling respective first contact means with respective second contact means, further comprising an electrically non-conductive encapsulating body molded directly to and about at least substantially all of said support, said electrically conductive means, and at least part of each of said electrical contact means to form an integral structure therewith, wherein said first plural electrical contact means comprises a plurality of female type electrical contacts, and further comprising cover means for covering said female contacts, said cover means including opening means therein for guiding respective male contacts into electrically conductive engagement with respective female contacts, said cover means and said encapsulating body being in engagement with each other about a perimeter of the device, weld connection means about such perimeter for securely joining said cover means and said encapsulating body.

3. The device of claim 2, further comprising a space in said device between said encapsulating body and said cover means, and weld tab means in said space for welded connection between said cover means and said encapsulating body to strengthen the device and the interconnection of said cover means and encapsulating body.

4. A programmed socket device for enabling usage of a substitute integrated circuit package with an electrical circuit component designed for plug-in connection at terminal connectors thereof with terminal members of another integrated circuit package where such substitute and another integrated circuit packages have functionally related terminal members located at different positions in respective terminal patterns, comprising:
   a generally planer support having opposite sides;
   plural first electrical contacts mounted on one side of said support in a prescribed pattern corresponding to the terminal pattern of such another integrated circuit package and projecting outwardly from said one side for plug-in connection with the terminal connectors of such electrical circuit component;

plural second electrical contacts mounted on the other side of said support in a prescribed pattern corresponding to the terminal pattern of such substitute integrated circuit package and projecting outwardly from said other side for plug-in connection with the terminal members of such substitute integrated circuit package; and
electrically conductive means positioned with respect to said support to electrically couple respective first electrical contacts with respective second electrical contacts for establishing electrical paths from terminal members of such substitute integrated circuit package to functionally related but differently located terminal connectors of such electrical circuit component.

5. The socket device of claim 4, further comprising an electrically non-conductive encapsulating body molded directly to and about at least substantially all of said support, said electrically conductive means, and at least part of each of said electrical contacts to form an integral structure therewith.

6. The socket device of claim 5, wherein said first electrical contacts comprise female-type contacts, said second electrical contacts comprise male-type contacts, and further comprising cover means for covering said female-type contacts, said cover means including opening means therein for guiding respective male terminal members of such substitute integrated circuit package into electrically conductive engagement with respective female-type contacts.

7. The socket device of claim 4, wherein said prescribed patterns of said first and second electrical contacts are substantially identical and aligned in a direction normal to said support, whereby respective pairs of first and second electrical contacts are located in substantially the same and aligned positions on said support but at opposite sides thereof, and said electrically conductive means provides the only electrical connection between respective first electrical contacts and respective second electrical contacts.

8. A method of enabling usage of a substitute integrated circuit package with an electrical circuit component designed for plug-in connection at terminal connectors thereof with terminal members of another integrated circuit package where such substitute and another integrated circuit packages have functionally related terminal members located at different positions in respective terminal patterns, comprising the steps of effecting plug-in connection between the terminal members of the substitute integrated circuit package and respective first electrical contacts of a programmed socket device further including second electrical contacts electrically connected to respective first electrical contacts to adapt the terminal pattern of the substitute integrated circuit package to that of the another integrated circuit package, and also effecting plug-in connection between the second electrical contacts of the programmed socket device and respective terminal connectors of the electrical circuit component, whereby the terminal members of the substitute integrated circuit package device will be operably coupled to functionally related but differently located terminal connectors of the electrical circuit component.

* * * * *